United States Patent
Nguyen

(10) Patent No.: US 7,009,541 B1
(45) Date of Patent: Mar. 7, 2006

(54) INPUT COMMON-MODE VOLTAGE FEEDBACK CIRCUIT FOR CONTINUOUS-TIME SIGMA-DELTA ANALOG-TO-DIGITAL CONVERTER

(75) Inventor: Khiem Nguyen, Tewksbury, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/970,213

(22) Filed: Oct. 21, 2004

(51) Int. Cl.
H03M 3/00 (2006.01)

(52) U.S. Cl. ..................................... 341/143; 341/120
(58) Field of Classification Search ................ 341/143, 341/155, 144, 120
See application file for complete search history.

(56) References Cited

U.S. PATENT DOCUMENTS

| | | | | |
|---|---|---|---|---|
| 4,918,399 A | * | 4/1990 | Devecchi et al. ........... | 330/253 |
| 5,039,989 A | * | 8/1991 | Welland et al. ............. | 341/143 |
| 5,426,385 A | * | 6/1995 | Lai ............................... | 327/57 |
| 5,442,352 A | * | 8/1995 | Jackson ....................... | 341/136 |
| 6,603,356 B1 | * | 8/2003 | Kim et al. ................... | 330/265 |
| 6,697,001 B1 | * | 2/2004 | Oliaei et al. ................ | 341/143 |
| 6,803,794 B1 | * | 10/2004 | Martin et al. ................ | 327/52 |
| 6,853,323 B1 | * | 2/2005 | Chen et al. ................. | 341/144 |
| 2001/0020870 A1 | * | 9/2001 | Laaser ........................ | 330/264 |
| 2004/0189392 A1 | * | 9/2004 | Kimura ...................... | 330/258 |
| 2004/0239783 A1 | * | 12/2004 | Imaizumi et al. ........... | 348/255 |

OTHER PUBLICATIONS

"Input Common-Mode Feedback Technique for Very Low Voltage CMOS Amplifiers", Duque-Carrillo et al., *IEEE 1999 International Symposium on Circuits and Systems Proceedings*, vol. 2, pp. 25-28 (Jul. 1999).

* cited by examiner

*Primary Examiner*—Peguy JeanPierre
(74) *Attorney, Agent, or Firm*—Gauthier & Connors LLP

(57) ABSTRACT

A novel circuit is used to monitor the common-mode voltage at the summing junctions of the first integrator in a continuous-time ΣΔ ADC, wherein the circuit produces a control voltage which adjusts the quiescent current of the feedback DAC to compensate for any common-mode offset current. Since the adjustment takes place within the feedback DAC, there is no extra noise added to the differential signal path. The implementation provides for no degradation to the SNR of the converter.

26 Claims, 10 Drawing Sheets

INPUT COMMON-MODE VOLTAGE FEEDBACK CIRCUIT FOR CONTINUOUS-TIME SIGMA-DELTA ANALOG-TO-DIGITAL CONVERTER

BACKGROUND OF THE INVENTION

This invention relates to mixed-signal converters of the sigma-delta noise shaping type, and more particularly, to mixed-signal analog-to-digital converter that employs a common-mode voltage feedback circuit.

Sigma-delta analog-to-digital converters (ADCs) provide for a means to achieve high resolution and low distortion at a relatively low cost compared to traditional Nyquist converters. The high resolution is achieved by oversampling the input signal and shaping the quantization noise in the band of interest into higher frequency region. The higher frequency noise can then be digitally filtered out by the subsequent digital filter stages. The resulting data is then down sampled to the desired sample rate at the output of the converter.

Typically, an audio sigma-delta ADC is implemented using discrete-time circuits such as switched capacitors for the following reasons. Switched capacitor circuits offer low sensitivity to clock jitter and are readily scalable with sampling rate. Moreover, tracking of coefficients of the loop is inherently good due to good matching of capacitors. However, due to the discrete-time nature, the converter suffers from harmonic distortion primarily caused by signal-dependent glitches captured by the sampling capacitors of the first integrator. In highly-integrated circuits such as a digital signal processor (DSP) with on-chip converters, it is very difficult to contain these undesirable glitches since the DSP is running at a much higher clock rate than the converter. Furthermore, for high performance converters, over 100 dB of signal-to-noise ratio (SNR), the sampling capacitors have to be large to reduce the thermal noise. Such a large sampling network emits current glitches back into the signal source which leads to electromagnetic interference (EMI).

Sigma-delta analog-to-digital converters are commonly designed using fully differential circuits to achieve good power supply rejection ratio, immunity to on-chip couplings, clock feed-through, charge injections, even-order harmonic distortions and other second-order non-ideal effects. Such fully differential circuits require a defined common-mode voltage to establish the proper operating point.

In a traditional fully-differential continuous-time sigma-delta converter with current-steering feedback DAC, the internal common-mode voltage of the integrator in the first stage of the converter is undefined when the input signal is AC coupled. When the input is DC coupled, the common voltage is defined by the external circuit. This voltage may not be the same as the desirable internal common-mode and may significantly degrade the performance of the converter.

Another problem with fully differential continuous-time ADC is the common-mode offset current from the feedback DAC. Since there is no mechanism for correcting this offset, both the positive and negative outputs of the differential integrator can peg to either positive or negative supply.

Yet another problem is that the input resistors of the integrator are built on chip, they may have mismatch as much as 1 percent. When a differential input signal, even from a balanced source, is applied to the ADC, the resistor mismatch will create a common-mode voltage swing at the summing junctions of the amplifier in the integrator. This voltage swing is a significant source of harmonic distortion in the converter.

FIG. 1 illustrates a simplified model of a 4-bit, $2^{nd}$-order sigma delta analog-to-digital converter with a continuous-time first-stage used in this invention. The setup primarily comprises a first summer circuit 101, continuous-time integrator 102, a second summer circuit 103, switched capacitor DAC 106, switched capacitor integrator 104, and current steering DAC 108. The continuous-time implementation of the first stage in the converter is much less susceptible to on-chip couplings than a switched capacitor implementation. Hence, the converter can be integrated into larger scale circuits in deep sub-micron processes without significant degradation in performance.

More over, since the input impedance is pure resistive, the circuit does not emit high frequency current glitches back to the external source. This yields a much lower electromagnetic interference (EMI) compared to a switched capacitor implementation. Hence, the converter is easier to use in EMI sensitive applications such as automotive systems.

FIGS. 2a–b illustrate two different approaches to implement the first stage of the converter. FIG. 2a shows the first approach which includes a fully-differential amplifier 202 with built-in output common-mode voltage control circuit, a pair of integrating capacitors 204 and 206, and a pair of input resistor 208 and 210. The current steering feedback DAC in FIG. 1 is also included as a part of the first stage.

FIG. 2b illustrates the second approach which comprises two single-ended amplifiers 212 and 214, a pair of capacitors 216 and 218, and a pair of resistors 220 and 222, and the feedback DAC. The positive input terminals of the amplifiers are connected to a reference voltage Vref 224.

FIG. 3 illustrates the implementation of a typical thermometer-code DAC used as the feedback DAC in the design. It consists of 2 PMOS devices MP1 302 and MP2 304, and 16 NMOS devices MN0 306 through MN15 308 (which form a bank of switching current cells, such as a 16 cell thermometer style DAC implementation). The PMOS devices 302 and 304 are biased by a voltage Vbias1 305, and the NMOS devices 306 and 308 are biased up by a voltage Vbias2 310. PMOS devices MP1 302 and MP2 304 are connected to the positive 312 and negative 314 DAC output terminals respectively. Each of these PMOS devices 302 and 304 conducts a current of magnitude I/2. Each of the NMOS devices MN0 306 to MN15 308 is connected to the positive 312 or negative 314 DAC output via a switch controlled by the data bit 316 or the complimentary data bit 318 respectively. Each NMOS device 306 or 308 conducts a current of magnitude 1/16.

In normal operation, when the DAC thermometer-code data input is at the logical value zero, eight bits are set to "1" and eight bits are set to "0". Therefore, the net output current delivered by the DAC is theoretically zero. In practice, however, there is a net CM offset current at the DAC output 318. This is due to mismatch between the push and pull current sources.

There are at least two problems with the approach of FIG. 2a. First, while the output of the integrator has a common mode (CM) voltage defined by a feedback circuit, the input CM voltage depends on the input source. When a DC coupled source is connected to the input of the converter, the CM of the source will define the operating point at input of the converter. However, the DAC has a net CM offset current due to circuit imperfection, wherein this current creates a voltage across the resistors R1 208 and R2 210. In this case, the voltage at the summing junctions of the amplifier may be different than the intended value and may bring the amplifier out of the linear range. Moreover, the DAC is designed to give the optimal thermal noise performance since it is one of the dominant noise sources in the converter. This implies that saturation voltage of the NMOS devices is almost near the internal CM value. Any significant decrease of the CM voltage at the summing junctions of the amplifier will bring the DAC of out the saturation region and will significantly degrade the converter distortion measurements.

Second, due to process imperfections and layout mismatch, R1 208 may differ from R2 210 by an error as much as 1%. When a differential signal is applied to the ADC input, the summing junctions of the amplifier will see a CM swing. This CM swing will cause second-order harmonic distortion in the ADC output.

FIG. 2b illustrates an instrumentation style implementation. The approach in FIG. 2b does not suffer from the above-mentioned resistor mismatch problem associated with the circuit of FIG. 1, but it does require an output and an input CM feedback circuit. Moreover, it consumes more power and silicon area, and has 3 dB more noise than the first approach (of FIG. 1). Therefore, it is more advantageous to implement the first approach in the ADC design.

A technique to shift the common-mode voltage in a low-voltage system is presented in the paper to Duque-Carillo et al. entitled, "Input common-mode feedback technique for very low voltage CMOS amplifiers." The circuit described by Duque-Carillo et al. has the ability to source and sink current and acts as a CM current attenuator so that the summing junctions can operate at a different CM voltage than that of the external signal source. However, implementation of such a circuit in a continuous-time integrator significantly degrades the signal-to-noise ratio (SNR) of the converter. This penalty comes directly as a result of the addition of the push-pull current sources in the mentioned technique. Since the noise gain of these devices is unity, the full noise strength of the CM attenuator circuit will appear at the output.

In the design of the ADC, the main noise sources are the feedback DAC and the input resistors. These components are optimized to yield the target SNR. If the mentioned technique is implemented, then the DAC has to be re-optimized to meet the target noise performance. This will lead to bigger chip area and higher power consumption. The impact becomes even more significant in smaller geometry processes such as 0.18u and below.

Whatever the precise merits, features, and advantages of the above cited references, none of them achieves or fulfills the purposes of the present invention. The present invention solves the above-mentioned problems via a small feedback circuit to stabilize the common-mode voltage of the first integrator and set it to a proper level.

SUMMARY OF THE INVENTION

The present invention provides for a control circuit and method to monitor the common mode voltage at the summing junctions of the first-stage integrator associated with a continuous-time sigma-delta analog-to-digital converter. The circuit produces a control voltage which adjusts the quiescent current of the feedback DAC to compensate for any common-mode offset current. As the adjustment takes place within the feedback DAC, no extra noise is added to the differential signal path. Furthermore, the circuit of the present invention causes no degradation to the signal-to-noise (SNR).

The present invention also provides for a method of partitioning a feedback DAC (such as a thermometer-coded DAC or a binary weighted DAC) in a continuous-time sigma-delta analog-to-digital converter, wherein the method comprises the steps of including at least a portion of said feedback DAC in a negative feedback loop and stabilizing a common mode (CM) voltage at the summing junctions of a continuous-time integrator via the negative feedback loop. The step of stabilizing CM voltage further comprises the steps of monitoring a common mode (CM) voltage (i.e., monitored via a triple-input amplifier, with three inputs of SJP, SJN, and Vref, and a single output that adjusts the quiescent current.) at the summing junctions of the continuous-time integrator and generating a control voltage that adjusts the quiescent current of the feedback DAC based on the monitored CM voltage, with the control voltage compensating for the CM offset current. The present invention also provides for the stabilization of the negative feedback loop via a compensation network implemented via a pair of capacitors and a pair of resistors.

DETAILED DESCRIPTION OF THE INVENTION

Although the present invention has been shown and described with respect to several preferred embodiments thereof, various changes, omissions and additions to the form and detail thereof, may be made therein, without departing from the spirit and scope of the invention.

Figure 3:
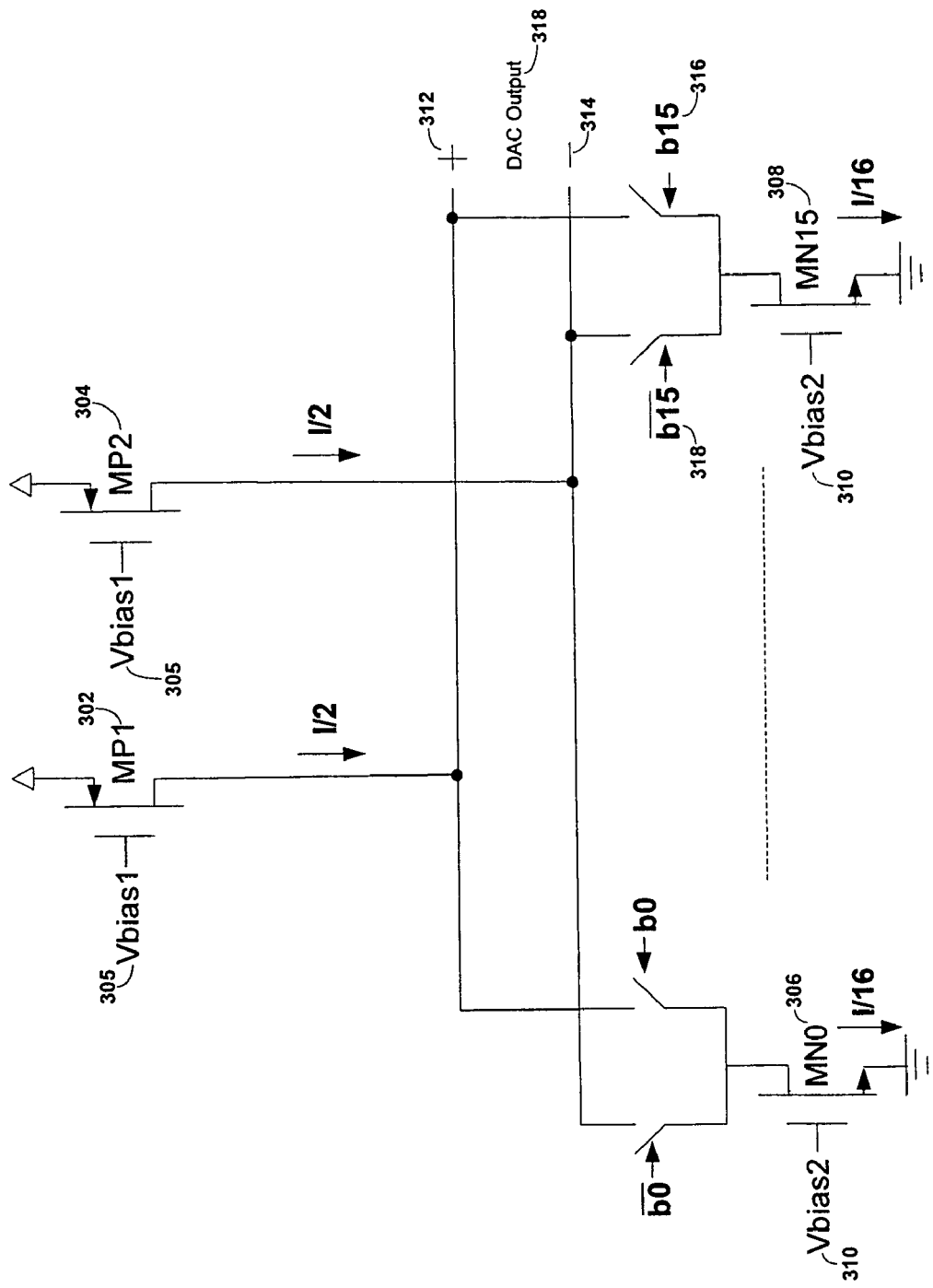
FIG. 3 illustrates the implementation of a typical thermometer-code DAC used as the feedback DAC in the design.

In FIG. 3, varying Vbias1 305 can adjust the net common mode (CM) current of the DAC. The design of the present invention comprises a circuit that monitors the voltage at the summing junctions of the amplifier. The present invention's circuit rejects any differential voltage and compares the CM voltage to a reference Vref. The circuit of the present invention adjusts the Vbias 1 in a negative feedback manner to stabilize the CM voltage at the summing junctions of the amplifier.

Figure 4A:
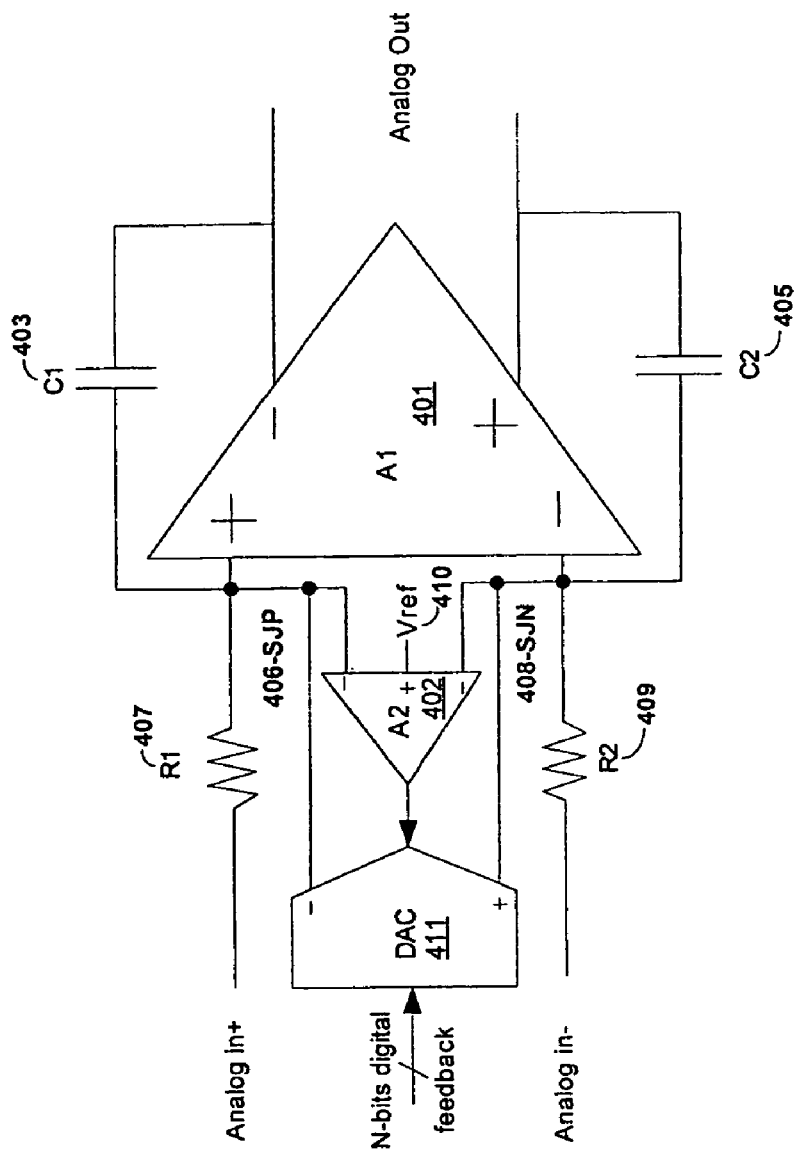
FIGS. 4a–b illustrate the present invention's differential and instrumentation implementation circuits.
Figure 4B:
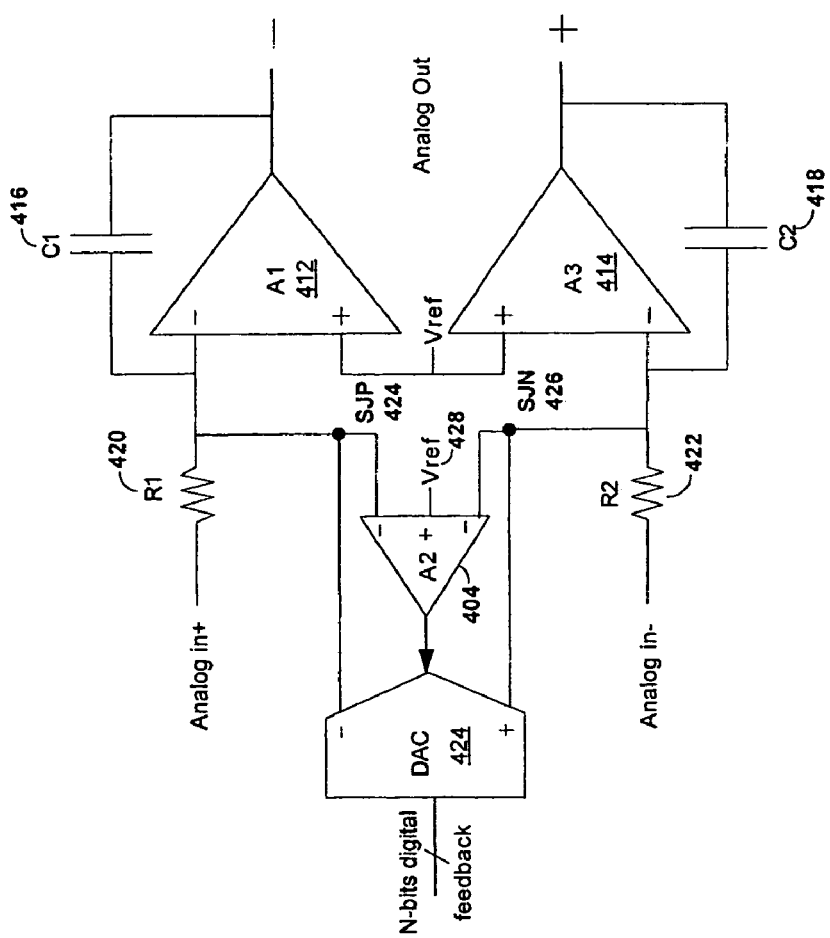

FIGS. 4a–b illustrates a pair of implementations of the present invention. FIG. 4a illustrates the present invention's differential style implementation circuit. FIG. 4b illustrates the present invention's differential and instrumentation implementation circuit.

It should be noted that although the DAC shown in the figures is a thermometer-code DAC, the type of DAC should not limit the scope of the present invention. For example, a binary weighted DAC could also be used to implement the present invention. However, it should be noted that such an implementation can be subjected to element-mismatch problem and hence, not the best choice.

Figure 5:
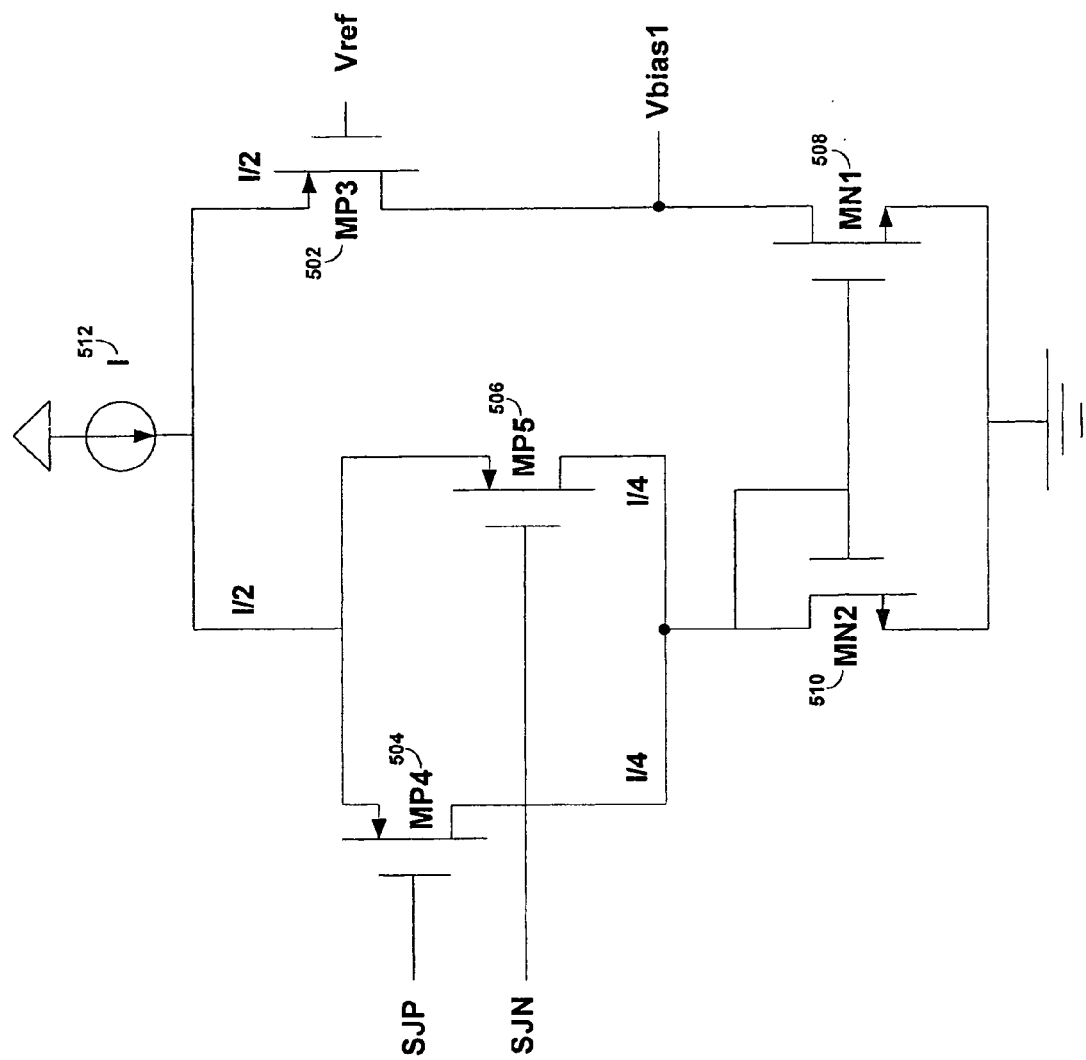
FIG. 5 illustrates an implementation of amplifier A2 shown in FIGS. 4a–b.

The implementation of amplifier A2 402 and 404 in FIGS. 4a–b is shown in FIG. 5. MP3 502 has a size of 2×, MP4 504 and MP5 506 have a size of 1×, MN1 508 and MN2 510 have a size of 1×. By sizing them in such a manner, it is seen that the circuit forms a balance triple-input and single-output amplifier. SJP and SJN are connected to the positive and negative summing junctions of amplifier as shown in FIG. 4. The current source 512 provides the bias current for the triple-input amplifier of FIGS. 4a and 4b.

FIG. 4a shows the first approach which includes a fully-differential amplifier 401 with built-in output common-mode voltage control circuit, a triple-input amplifier 402, a pair of integrating capacitors 403 and 405, a pair of input resistor 407 and 409, and a feedback DAC 411. In FIG. 4a, SJP 406 and SJN 408 are connected to the positive and negative summing junctions of the amplifier A1 401 respectively. The triple-input terminal amplifier 402 compares SJP 406, SJN 408, and Vref 410. The circuit does not respond to any differential signal applied to SJP 406 and SJN 408. If the CM at SJP 406 and SJN 408 varies, then Vbias 1 changes. Since the circuit is connected to the DAC 411 to form a negative feedback loop, Vbias changes in such a way that stabilizes the CM at SJP 406 and SJN 408.

FIG. 4b illustrates the present invention's instrumentation style implementation. The circuit of FIG. 4b comprises two single-ended amplifiers 412 and 414, a triple-input amplifier 404, a pair of capacitors 416 and 418, and a pair of resistors 420 and 422, and the feedback DAC 424. The positive input terminals of the amplifiers are connected to a reference voltage Vref 224. The triple-input terminal amplifier 404 compares SJP 424, SJN 426, and Vref 428. As in FIG. 4a, the circuit does not respond to any differential signal applied to SJP 424 and SJN 428. If the CM at SJP 424 and SJN 428 varies, then Vbias 1 changes. Since the circuit is connected to the DAC 424 to form a negative feedback loop, Vbias changes in such a way that stabilizes the CM at SJP 424 and SJN 428.

Figure 6:
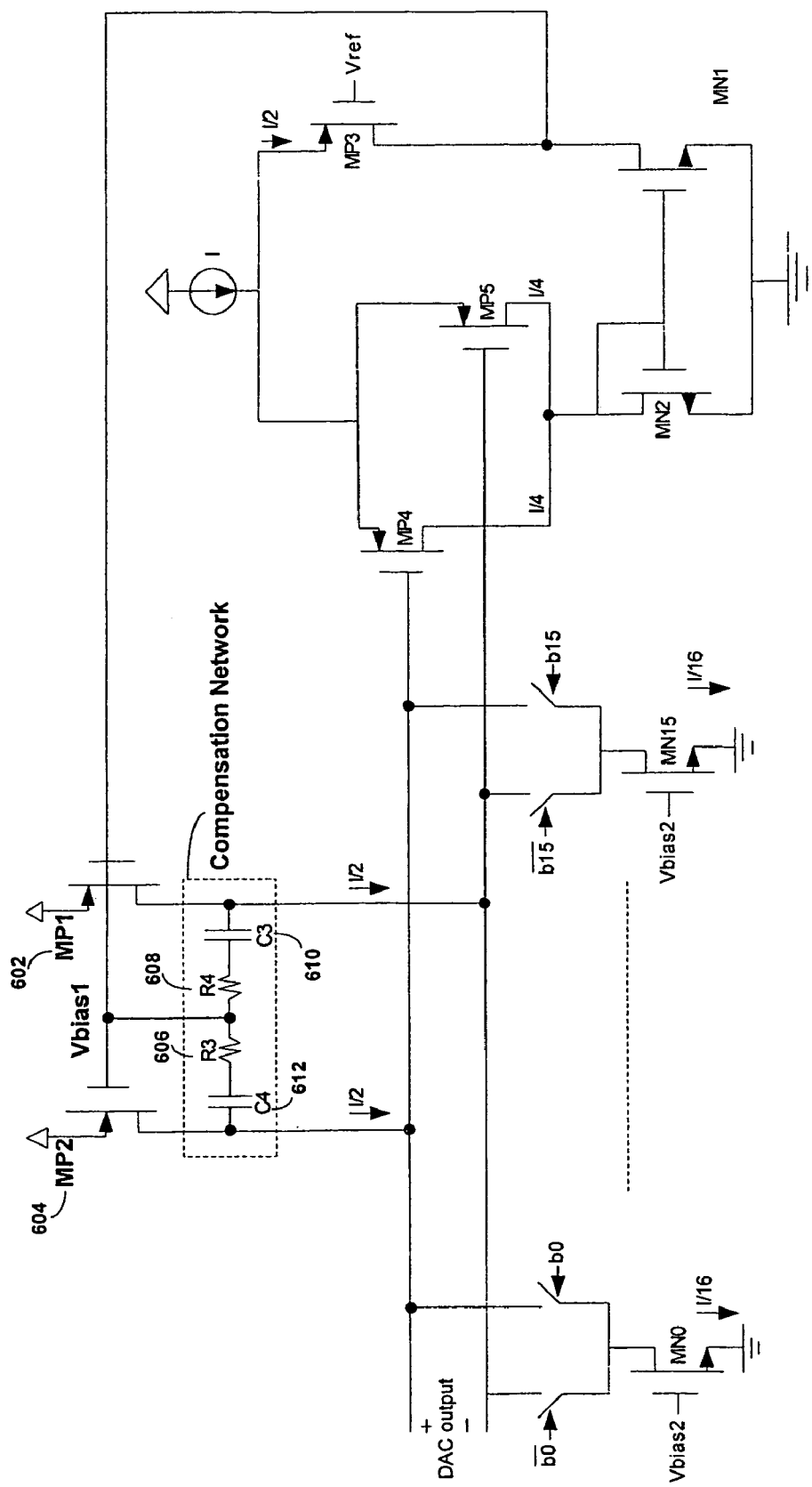
FIG. 6 illustrates the use of a compensation network in conjunction with the present invention.

FIG. 6 illustrates the use of a compensation network in conjunction with the present invention, wherein the compensation network is used to enhance the stability of the negative feedback loop. Without this compensation network, the loop may become unstable. The compensation network comprises resistors R3 606 and R4 608 and C3 610 and C4 612, wherein the compensation network is coupled to a pair of PMOS devices MP1 602 and MP2 604.

An advantage of the present invention's technique of CM stabilization is that the circuits of FIGS. 4a–b do not add any extra noise into the main ADC.

Another advantage of the present invention's technique is low power consumption. Since the loop only has to work with the input signal bandwidth, the gain bandwidth requirement for the three-input amplifier is at most the same as the input. Therefore, the power consumption is insignificant.

Yet another advantage of the present invention's technique is that the loop gain does not have to be large since it only has to suppress an already small variation of CM at the summing junctions of the amplifier.

Additionally, the circuits of FIGS. 4a–b do not require a clean Vref since any variation of Vref within the loop bandwidth will inject a CM signal into the ADC and will be rejected by the differential circuits.

Also, the power-up time of the continuous time integrator is shorter due to the assistance of the CM feed-back loop to the main loop.

Figure 1:
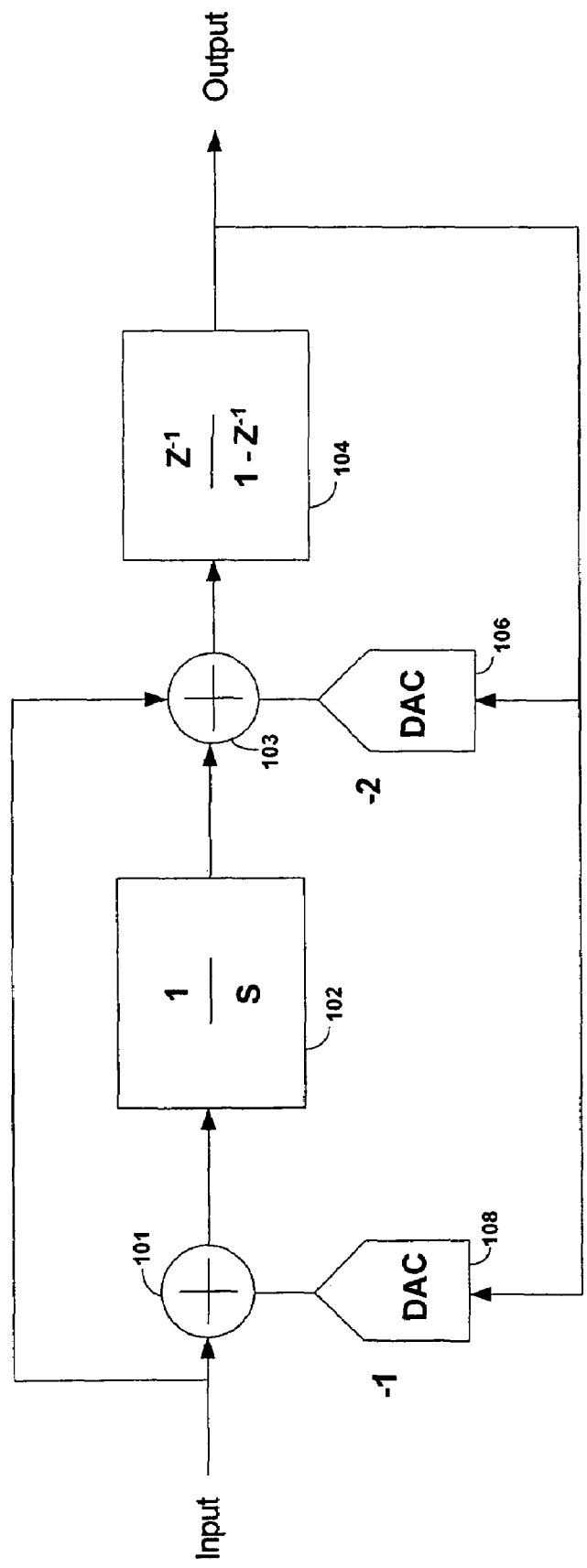
FIG. 1 illustrates a simplified model of a 4-bit, $2^{nd}$-order sigma delta analog-to-digital converter with a continuous-time first-stage used in this invention.
Figure 2A:
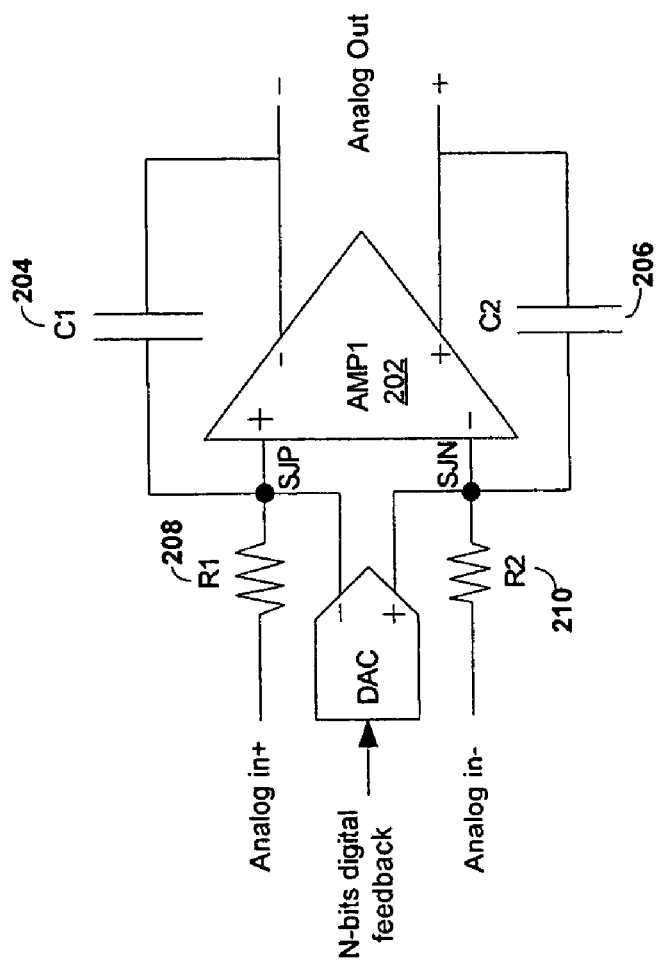
FIGS. 2a–b illustrate two different prior art approaches to implement the first stage of the converter.
Figure 2B:
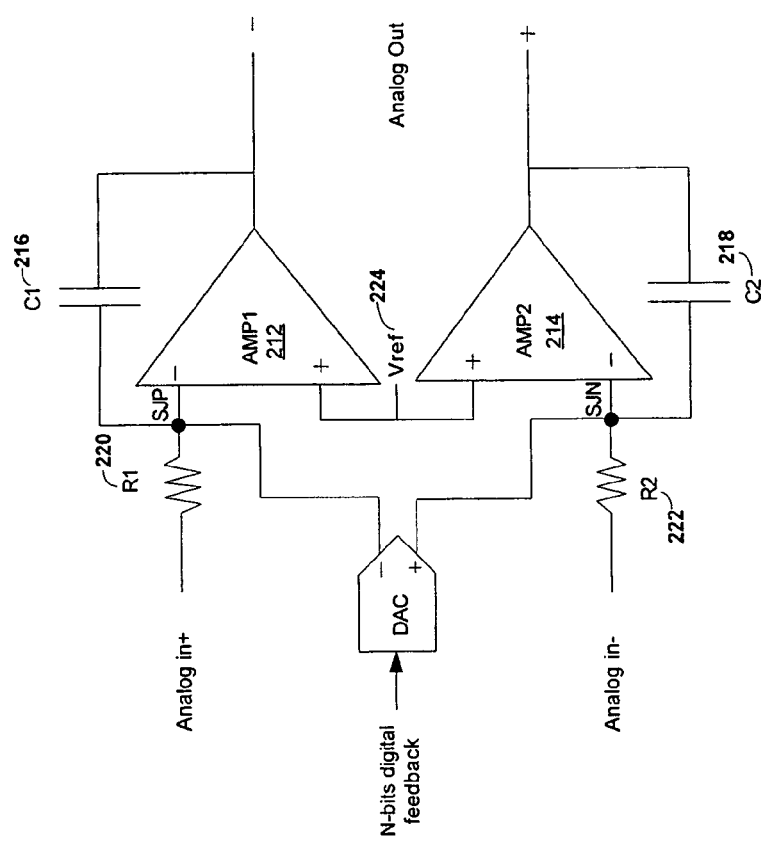

It should be noted that instead of adjusting Vbias1 305 of FIG. 3, Vbias2 310 of FIG. 2 can be adjusted for similar results and the choice between Vbias1 305 or Vbias2 310 should not be used to limit the scope of the present invention. However, it should also be noted that it is advantageous to adjust Vbias1 since this does not result in any amplitude modulation effect.

Figure 7:
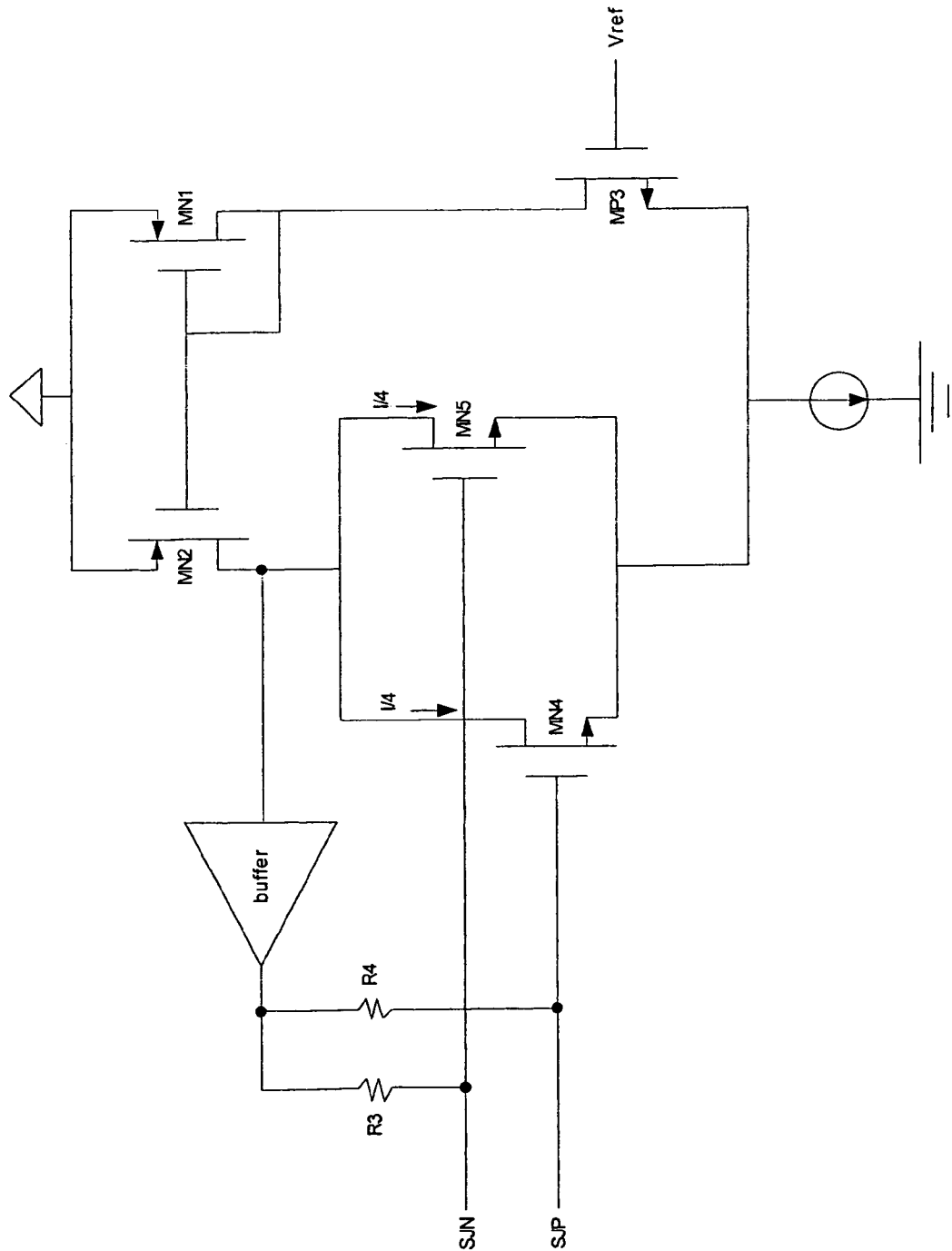
FIG. 7 illustrates a CM servo loop providing the quiescent or offset current.

Furthermore, the present invention is also not limited to adjusting the bias voltage(s) of the feedback DAC in order to stabilize the CM voltage at the summing junctions of the amplifier. For example, the DAC can be partitioned so that it consists of only signal dependent switching current source. The quiescent or offset current can then be provided by a CM servo loop such as on in FIG. 7. The circuit in FIG. 7 assumes that the feedback DAC consists of only the 16 NMOS devices MN0 to MN15 as in FIG. 3. As seen, the triple-input amplifier compares the CM at SJP and SJN to Vref and creates a voltage at its output. This output is buffered up to drive a pair of resistor R3 and R4. The currents through these resistors compensate for the quiescent current required by switching NMOS DAC.

Figure 8:
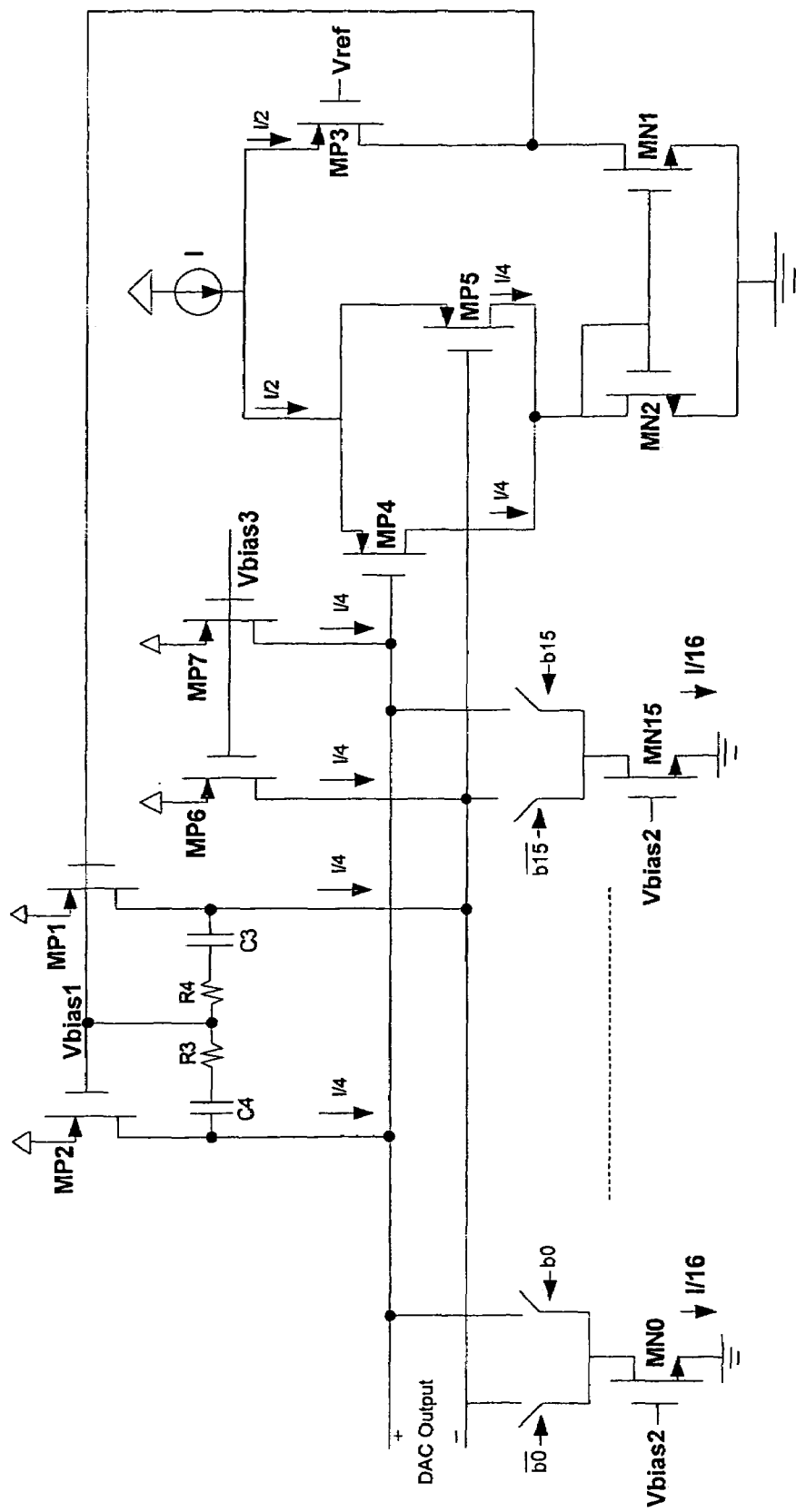
FIG. 8 illustrates a variation of the present invention's technique wherein the pair of PMOS devices MP1 and MP2 (of FIG. 6) is split into two parallel pairs of PMOSs.

Yet another variation of the present invention's technique is shown in FIG. 8. In this example, the pair of PMOS devices MP1 802 and MP2 804 in FIG. 6 are split into two parallel pairs of PMOS devices. The first pair, MP6-MP7, has the gates connected to a fixed bias voltage. This pair provides one-half of the required quiescent current of the DAC. The second pair, MP1-MP2, has the gates connected to the output of amplifier (Vbias1) in FIG. 5. The operation of the triple-input amplifier and the pair MP1-MP2 is as described above. This variation yields a lower loop gain in the negative feedback loop and therefore, easier to compensate. However, this result comes at a cost of smaller CM stabilization range.

What is claimed is:

1. A method of partitioning a feedback DAC in a continuous-time sigma-delta analog-to-digital converter, said method comprising the steps of:
    including at least a portion of said feedback DAC in a negative feedback loop; and
    stabilizing an input common mode (CM) voltage at the summing junctions of a continuous-time integrator via said negative feedback loop, wherein said continuous-time integrator is part of said continuous-time sigma-delta analog-to-digital converter.

2. A method as per claim 1, wherein said step of stabilizing said input CM voltage further comprises the steps of:
    monitoring the common mode (CM) voltage at the summing junctions of said continuous-time integrator; and
    generating a control voltage that adjusts a quiescent current of said feedback DAC based on said monitored CM voltage.

3. A method as per claim 2, wherein said adjustment of quiescent current is within said feedback DAC.

4. A method as per claim 2, wherein said CM voltage is monitored via a triple-input amplifier with inputs SJP, SJN, and Vref, said amplifier generating a bias voltage for said feedback DAC.

5. A method as per claim 1, wherein said DAC is a thermometer-code DAC.

6. A method as per claim 1, wherein said DAC is a binary weighted DAC.

7. A method as per claim 1, wherein said method further comprises the step of enhancing the stability of said negative feedback loop via a compensation network.

8. A method as per claim 7, wherein said compensation network is implemented via a pair of capacitors and a pair of resistors.

9. A method as per claim 7, wherein said feedback DAC and said negative feedback loop suppress variation of the CM voltage at the summing junctions of an integrator due to resistor mismatch.

10. A method of partitioning a feedback DAC in a continuous-time sigma-delta analog-to-digital converter comprising, in a first stage, a continuous-time integrator and said feedback DAC, said method comprising the steps of:
   including at least a portion of said feedback DAC in a negative feedback loop; and
   monitoring an input common mode (CM) voltage at the summing junctions of said continuous-time integrator; and
   generating a control voltage that adjusts the circuit generating a quiescent current of said feedback DAC based on said monitored CM voltage.

11. A method as per claim 10, wherein said adjustment of quiescent current is partially within said feedback DAC.

12. A method as per claim 10, wherein said CM voltage is monitored via a triple-input amplifier, with inputs of SJP, SJN, and Vref, said triple-input amplifier outputs a bias voltage for said feedback DAC.

13. A method as per claim 10, wherein said DAC is a thermometer-code DAC.

14. A method as per claim 10, wherein said DAC is a binary weighted DAC.

15. A method as per claim 10, wherein said method further comprises the step of enhancing the stability of said negative feedback loop via a compensation network.

16. A method as per claim 15, wherein said compensation network is implemented via a pair of capacitors and a pair of resistors.

17. A method of partitioning a feedback DAC in a continuous-time sigma-delta analog-to-digital converter, said method comprising the steps of
   including a non-input signal dependent portion of said feedback DAC in a negative feedback loop; and
   correcting a quiescent current of said feedback DAC or an input CM offset current of an integrator, or both, via said negative feedback loop, wherein said integrator is part of said continuous-time sigma-delta analog-to-digital converter.

18. A method as per claim 17, wherein said DAC is a thermometer-code DAC.

19. A method as per claim 17, wherein said DAC is a binary weighted DAC.

20. A method as per claim 17, wherein said method further comprises the step of stabilizing said negative feedback loop via a compensation network.

21. A method as per claim 20, wherein said compensation network is implemented via a pair of capacitors and a pair of resistors.

22. A method to adjust the bias voltages of a feedback DAC in a continuous-time sigma-delta analog-to-digital converter, said method comprising:
   including at least a portion of said feedback DAC in a negative feedback loop; and
   stabilizing an input common mode (CM) voltage of a continuous-time integrator that is part of said continuous-time sigma-delta analog-to-digital converter via said negative feedback loop, wherein bias voltages of said feedback DAC are changed to stabilize said CM voltage.

23. An amplifier embedded in a negative feedback loop in a continuous-time sigma-delta analog-to-digital converter, said continuous-time sigma-delta analog-to-digital converter comprising, in a first state, a continuous-time integrator and a feedback DAC, said amplifier comprising:
   an input means SJP receiving positive summing junction voltage;
   an input means SJN receiving negative summing junction voltage;
   an input means VREF receiving a reference voltage;
   an output means adjusting a quiescent current of said feedback DAC, wherein said amplifier monitors an input common mode (CM) voltage at the summing junctions of said continuous-time integrator and generates a control voltage that adjusts said quiescent current of said feedback DAC based on said monitored CM voltage.

24. An amplifier as in claim 23, wherein stability of said amplifier is enhanced via a compensation network.

25. An amplifier as in claim 24, wherein said compensation network comprises a pair of resistors and a pair of capacitors.

26. An amplifier as in claim 23, wherein said amplifier is implemented via three PMOS each receiving as input SJP, SJN, and Vref respectively, two NMOS devices working in conjunction with said PMOS devices to output a voltage Vbias, and a current source I providing a bias current for said amplifier.

* * * * *